US006244422B1

(12) United States Patent
Bai

(10) Patent No.: US 6,244,422 B1
(45) Date of Patent: Jun. 12, 2001

(54) APPARATUS FOR SENSING AND CONTROLLING TIPPING MOVEMENT OF A SEMICONDUCTOR BOAT

(75) Inventor: Jun-Rung Bai, Ching-Shui (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/283,357

(22) Filed: Mar. 31, 1999

(51) Int. Cl.⁷ ..................................................... B65G 25/00

(52) U.S. Cl. ........................ 198/464.4; 414/940; 414/674; 294/907; 198/371; 198/395

(58) Field of Search ..................................... 414/674, 940, 414/222.01, 222.06, 222.12, 226.05; 198/464.4, 395, 751; 221/96; 187/279; 901/49, 30; 294/1.1, 32, 90, 907, 902

(56) References Cited

U.S. PATENT DOCUMENTS

| 842,294 | * | 1/1907 | Baldwin ............................. 187/279 |
| 2,497,005 | * | 2/1950 | McConnell ............................. 294/32 |
| 4,655,674 | * | 4/1987 | Kohler et al. ........................ 901/49 X |
| 4,977,981 | * | 12/1990 | Paquin ................................. 187/279 |
| 5,028,195 | * | 7/1991 | Ishii et al. ......................... 414/940 X |
| 5,123,804 | * | 6/1992 | Ishii et al. ......................... 294/902 X |
| 5,293,322 | * | 3/1994 | Yagi et al. .......................... 901/49 X |
| 5,415,447 | * | 5/1995 | Moore et al. ........................ 294/32 X |

* cited by examiner

Primary Examiner—Donald W. Underwood
(74) Attorney, Agent, or Firm—Tung & Associates

(57) ABSTRACT

A guard fence is mounted on a transfer arm used to transport a boat carrying semiconductor wafers. The fence limits tipping movement of the boat and includes a plurality of sensors to sense tipping movement of both the top and bottom of the boat, in opposite tipping directions. A guard cover includes sensors that sense when the boat is tipped off-axis before the boat is moved into a process chamber by a boat elevator. Each of the sensors delivers signals to a controller which controls the operation of the transfer and elevator and interrupts operation thereof when the boat has tipped off-axis.

12 Claims, 3 Drawing Sheets

APPARATUS FOR SENSING AND CONTROLLING TIPPING MOVEMENT OF A SEMICONDUCTOR BOAT

TECHNICAL FIELD

The present invention broadly relates to apparatus for moving and transporting boats carrying semiconductor devices, such as wafers, and deals more particularly with apparatus for sensing and controlling the tipping motion of a boat during movement thereof.

BACKGROUND OF THE INVENTION

A boat is often used in semiconductor manufacturing processes as a carrier for holding and transporting a plurality of semiconductor devices, such as wafers. The boats are transported using various types of specialized handling equipment, such that an entire batch of wafers carried on a boat is processed at the same time. One particular set of handling equipment is employed to move a boat between a standby or transfer position, to a loading position from which equipment, through a series of mechanized movements, transports the boat into a processing station, such as a furnace, for example, where a diffusion operation is performed. Following the simultaneous processing of all the wafers carried on a given boat in a single batch processing operation, the boat is withdrawn in a reverse set of movements by the handling equipment to a transfer station where the boat is transported by other transport mechanisms to another processing station.

The boat handling equipment referred to above typically comprises a boat transfer unit, a boat elevator, a boat clamp and a boat inserter controller. The boat transfer unit, which includes a transfer arm on which the boat sits, transfers the boat from the wafer transfer position, to the loading position vertically aligned above the boat elevator. The boat elevator moves upwardly to contact and engage the boat, whereupon the boat is clamped to the elevator which then moves the boat upwardly into a process chamber. The boat transfer arm typically includes a series of stops and alignment pins which help locate and stabilize the boat on the arm, however the boat is not securely clamped to the arm, and thus is subject to tipping as a result of numerous influences such as vibrations or jolting caused by the equipment or by events such as earth tremors.

Since the boat transfer sequence, like most operations during the fabrication process, is carried out completely automatically by computer controlled robotic mechanisms, it has not been possible to detect when a boat has tipped on a transfer arm to any degree. As a result, where tipping forces are severe, the entire boat may tip over during the transfer process, thus resulting in damage to the wafers, equipment down time and related reduction in throughput. Even where forces causing a boat to tip are not severe, the tipping motion may be sufficient to move the boat out of its normal on-axis alignment position on the transfer arm. This slight off-axis tilt of the boat can result in the boat not moving squarely into the process chamber, but rather colliding with the chamber walls or a scavenger cover disposed adjacent one end of the chamber. This collision, again, can result in process interruption requiring human intervention, as well as wafer damage.

It is apparent then that there is a clear need in the art for apparatus for both sensing when a boat has tipped beyond a threshold level requiring attention, as well as for preventing severe tipping or toppling over of a boat on a transfer arm.

SUMMARY OF THE INVENTION

According to one aspect of the invention, apparatus is provided for preventing tipping of a semiconductor boat carried on a moveable transport arm, which comprises fence structure mounted on the arm that extends upwardly from the arm and partially surrounds the boat such that the fence engages the tipping boat and limits tipping movement of the boat. The fence structure includes an arcuate fence mounted above the arm by vertical supports, and several displaceable guard sections which are resiliently mounted so as to absorb shock when engaged by a tipping boat. A plurality of sensors sense the displacement of each of the guard sections, and send signals to a boat transfer mechanism controller when the boat engages one of the guard sections. A second set of motion sensors are mounted on the arm to sense tipping movement of the base of the boat. Finally, a third series of sensors are mounted on a displaceable cover positioned above the boat elevator, and are operative to send tilt detect signals to the controller when the elevator attempts to move an off-axis, tilted boat upwardly into a process chamber.

According to another aspect of the invention, apparatus is provided for controlling the tipping movement of a boat carried on a transport arm comprising sensor means responsive to the tipping movement of the boat for producing an electrical signal indicative of the tipping movement, and control means coupled with the sensor means and responsive to the electrical signal for controlling the operation of the elevator. The sensor means comprises a first set of sensors carried on a fence which limits the movement of the boat, that produce tip detection signals indicating tipping movement of an upper portion of the boat. The sensor means includes a second set of sensors mounted on the transfer arm to sense tipping movement of the bottom of the boat in an opposite direction and are also operative to send tip detection signals to the controller. A third set of sensors mounted above the boat elevator sense engagement of the boat with a scavenger cover when the elevator attempts to move an off-axis, tilted boat into a process chamber.

In their preferred form, the sensors comprise simple limit switches which include displaceable mechanical elements that produce an electrical signal when actuated by the tipping movement of the boat. The controller typically comprises a programmed computer control, such as a PLC which is responsive to any of the sensors to interrupt both transfer and movement operations so as to avoid damage to the boat or wafers.

It is therefore a primary object of the present invention to provide apparatus for sensing and controlling the tipping movement of a semiconductor boat carried on a transfer arm.

Another object of the invention is to provide apparatus as described above which physically limits the tipping motion of the boat on the arm.

Another object of the invention is to provide apparatus as aforementioned which senses tipping motion either a lower or upper portion of the boat, in either of two directions.

A still further object of the invention is to provide apparatus as described above which includes a controller for automatically interrupting the boat transfer process when boat tipping is sensed, thereby to prevent damage to the boat or wafers.

These, and further objects and advantages of the present invention will be made clear or will become apparent during the course of the following description of a preferred embodiment.

BRIEF DESCRIPTION OF THE DRAWINGS

In the drawings, which form an integral part of the specification and are to be read in conjunction therewith, and in which like reference numerals designate identical components in the various views.

DESCRIPTION OF THE PREFERRED EMBODIMENT

Figure 1:
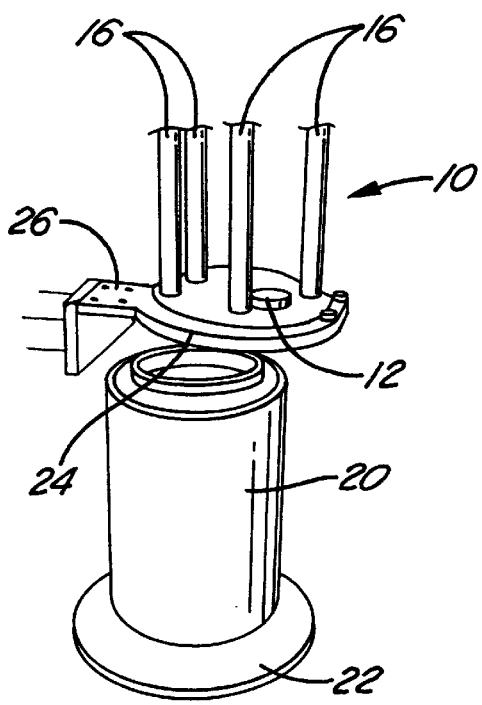
FIGS. 1–4 are perspective views of a boat and related boat transfer mechanism in successive stages of operation.
Figure 2:
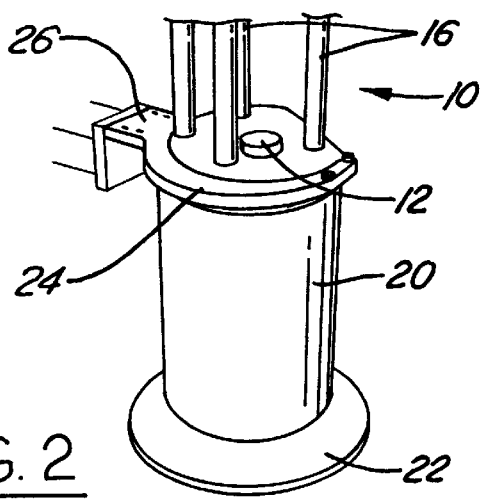
Figure 3:
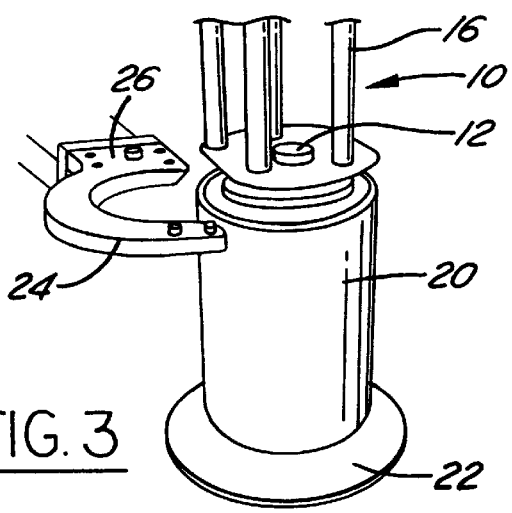
Figure 4:
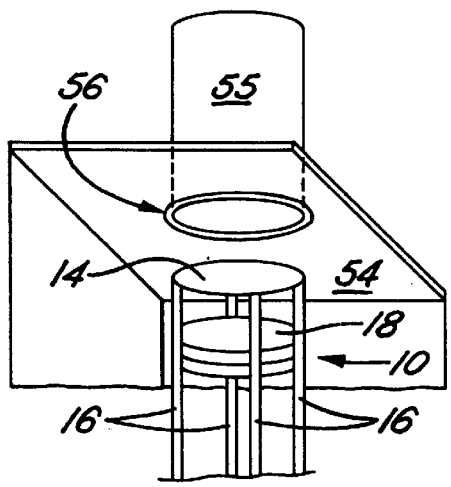
Figure 5:
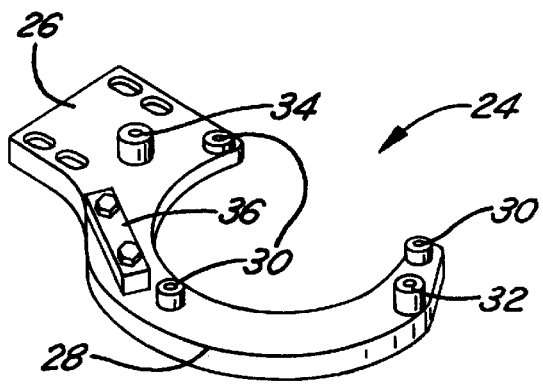
FIG. 5 is a perspective view of the boat transfer arm, the guard fence and sensors not shown for sake of clarity.

Referring first to FIGS. 1–4, the present invention relates to apparatus for moving a boat generally indicated with the numeral 10 containing semiconductor devices, such as wafers 18, in a lateral direction from a wafer transfer position, to a loading position axially aligned and immediately above a boat elevator 22, which is motorized to move vertically upwardly. The elevator 22 includes a base 20 upon which the boat 10 is clamped after the latter is moved to a position vertically aligned above the elevator 22.

The boat 10 includes a circular base and top, 12 and 14 respectively which are interconnected by four vertical struts or supports 16. The interior faces of supports 16 contain grooves to receive the edges of the wafers 18 so as to hold a plurality of the wafers in vertically spaced apart relationship. The boat 10 is moved from its wafer transfer position to a loading position immediately above the elevator 22 by means of a transfer arm 24 which is coupled with a motorized transfer mechanism 26 that moves the arm 24 laterally between the two operative positions, respectively associated with the wafer transfer and loading positions referred to above. In operation, the wafer transfer arm picks up the boat 10 at the wafer transfer position and transfers it laterally to the loading position immediately above the elevator 22. Then, the elevator 22 moves upwardly until the base 20 engages the bottom of the bottom wall 12 of the boat 10, whereupon the boat 10 is clamped to the base 20 and the transfer arm 24 is moved away, back to its wafer transfer position. Continued vertical movement of the elevator 22 causes the boat 10 to move upwardly through an opening 56 and an upper wall 54 of an enclosure until the boat 14 moves into a processing chamber 55. After a processing step is conducted on the wafers 18 held by the boat 10, the elevator 22 is then again actuated so as to move the boat 10 downwardly so as to withdraw the boat 10 from the chamber 55. The elevator 22 has moved to its fully lowered position, the arm 24 moves laterally to pick up the boat 10 and move it back to its wafer transfer position.

Figure 6:
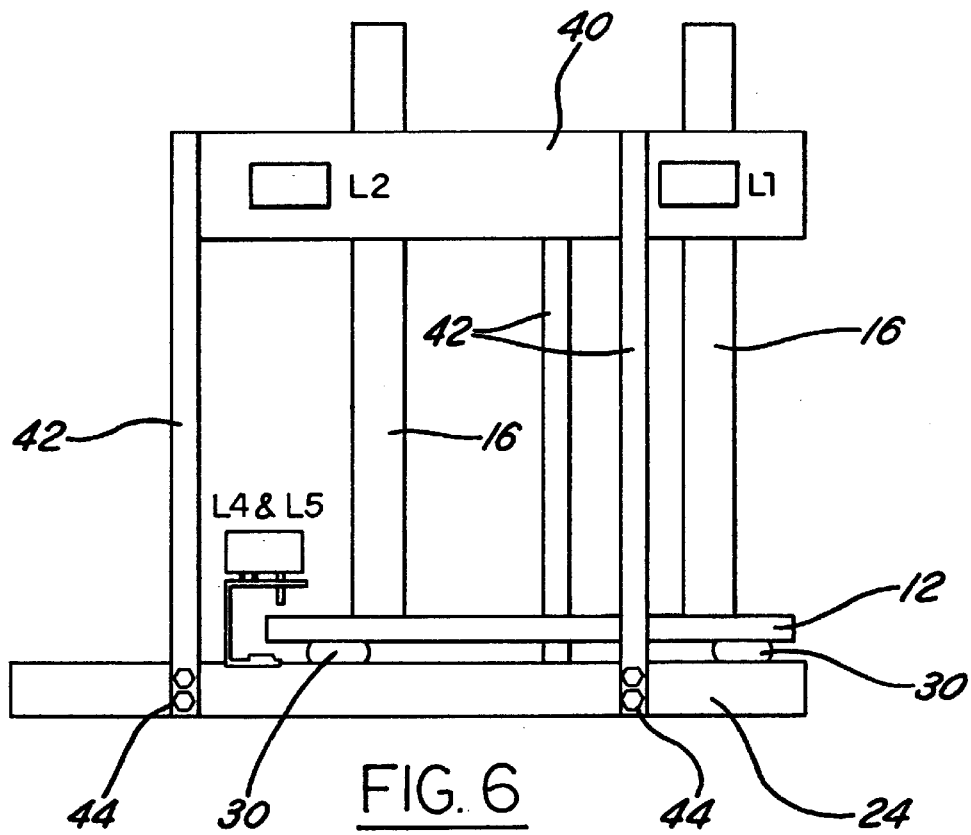
FIG. 6 is an enlarged, side view of the transfer arm having the novel sensor means of the present invention mounted thereon, a boat being shown carried on the arm.
Figure 7:
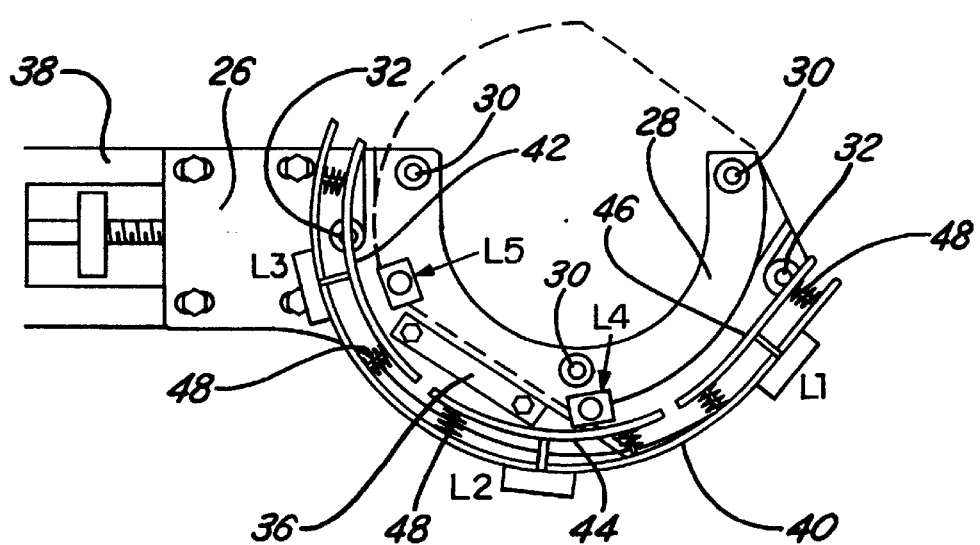
FIG. 7 is a plan view of the transfer arm having the fence and sensor mounted thereon, the position of the boat being indicated in the phantom.
Figure 8:
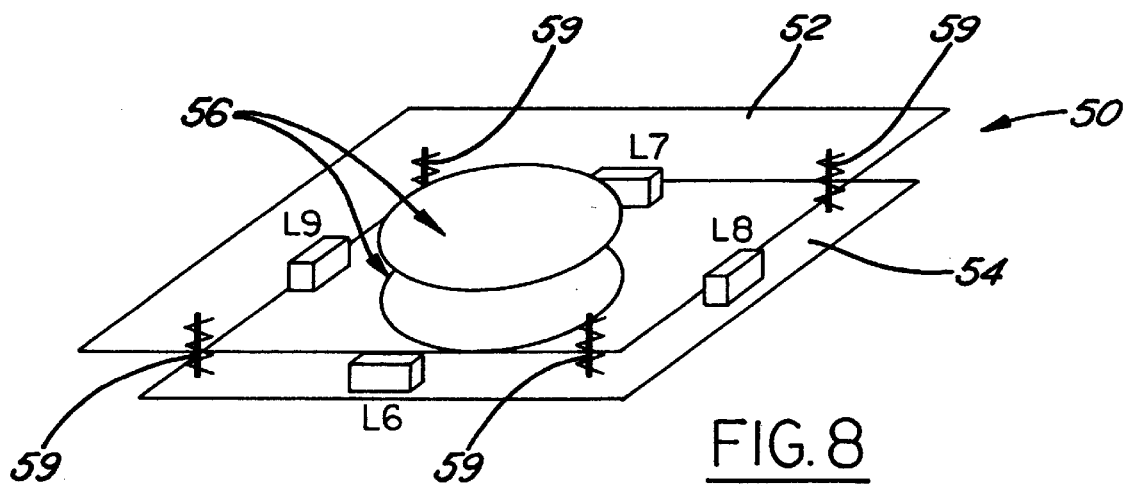
FIG. 8 is a perspective view of the scavenger cover having a sensing plate mounted on the bottom thereof; and, FIG. 9 is a combined block and schematic diagram of the circuit for sensing and controlling boat tipping and boat transfer movement which forms a part of the present invention.

Referring now also to FIGS. 5–9, the transfer arm 24 includes a generally "C" shaped section 28 which transitions on one end thereof to a connector arm 26 that is adapted to be secured, as by screws to a connector 38 forming part of the motorized transfer arm mechanism. The transfer arm 24 includes three spaced apart boat supports 30, preferably of a quartz material which form the sole points of contact and support for the boat 10. As best seen in FIG. 6, the boat supports 30 contact the lower face of the base 12 of the boat 10. In order to assure that the boat 10 is properly registered on arm 24, a pair of alignment pins 32–34 are provided, also preferably made of quartz. Finally, a generally rectangular stop 36 is provided on the top surface of the arm 24, which includes a straight inner face that engages a corresponding straight edge of the bottom wall 12 of boat 10. The stop 36 in combination with the alignment pins 32–34 engage the outer edge of base 12 at three spaced apart locations so as to properly locate the boat 10 on the arm 24.

As previously discussed, since the boat 10 merely sits on top of the arm 24, supported only at three points (supports 30), the boat 10 is subject to tipping during movement from the wafer transfer position to the loading position. In accordance with the present invention apparatus is provided for sensing and controlling the tipping motion of the boat 10, which broadly comprises fence structure that includes a generally arcuate, "C" shaped fence 40 supported in spaced relationship above the arm 24 by means of three spaced apart, vertical struts or supports 42. The upper ends of supports 42 are secured to the fence 40 as by welding, and the lower ends of the supports 42 are secured to the outer edge of the arm 24, as by screws 44. On the interior face of the fence 40 there is provided three guard fence sections 42, 44, and 46 which are resiliently mounted as by spring elements 48 to the interior face of the fence 40, so as to be inwardly displaceable against the biasing influence of the springs 48 in the event that the boat 10 tips into engagement with any one of the guard sections 42–46.

Figure 9:
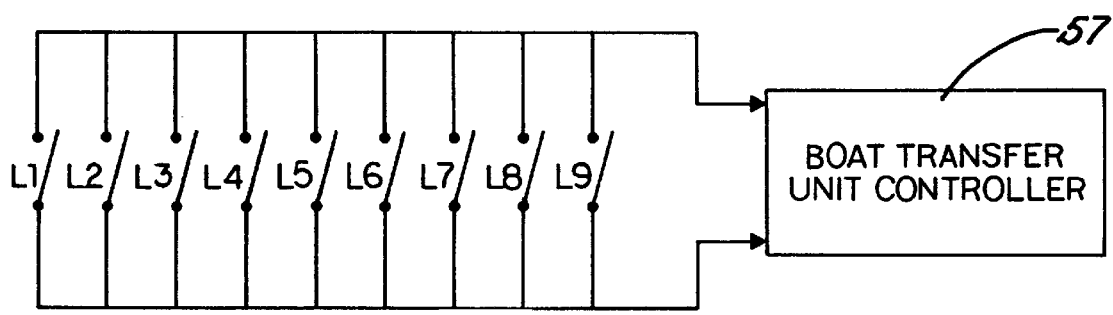

Also mounted on the exterior face of the fence 40 are three spaced apart sensors which may be in the form of limit switches L1, L2, and L3. Limit switches L1–L3 are mechanically connected to an associated one of the guard sections 46, 44, 42 so as to be actuated when the corresponding guard section is inwardly displaced upon engagement therewith of the boat 10. Each of the limit switches L1–L3, when actuated, closes a normally open switch which sends an electrical signal to a boat transfer control unit 57. Limit switches L1–L3 therefore sense tipping movement of an upper portion of the boat 10 in any of three general directions, all of which are generally inwardly toward the fence 40. In order to sense outward tipping of the boat 10, away from the fence 40, there are provided a pair of limit switches L4, L5, which are mounted on and circumferentially spaced around the perimeter of the "C" shaped section 28 of the arm 24. As best seen in FIG. 6, limit switches L4, L5 each include a mechanical actuator disposed immediately above an edge of the bottom wall 12 of boat 10 so as to be contacted upon outward tipping of the boat 10. Closure of either of the limit switches L4, L5 closes a switch, as best seen in FIG. 9 which sends an electrical signal to the boat transfer unit controller 57.

From the above, it may be appreciated that the invention not only provides a fence 40 for limiting tipping movement of the boat, but also provides sensing means for delivering electrical signals to the controller 57 providing an indication that tipping movement is occurring. The controller 57 is responsive to such signals to stop movement of the transfer arm 24 and/or the elevator 22 so as to minimize the possibility of the boat 10 toppling over. As a further means of sensing undesirable tipping movement of a boat, a plate 54 having a central aperture 56 therein is resiliently mounted by means of springs, for example, on the bottom wall of the scavenger cover 52. Four additional limit switches L6, L7, L8, and L9 are provided to sense upper deflection of any of the four edges of the plate 54. Such deflection of the plate 54 may occur when the boat has tipped slightly to an off-axis position causing the upper extremities of the boat to engage the bottom surface of the plate 54 rather than passing through the aperture 56. Upon actuation of any one of the limit switches L6–L9, a signal is delivered as seen in FIG. 9, to the controller 57, which reacts by immediately stopping the elevator 22 so that no damage is done either to the boat 10 or the elevator mechanism 22.

From the foregoing, it may be appreciated that the apparatus for sensing and controlling the tipping of a semiconductor boat as described above not only provides for the reliable accomplishment of the objects of the invention, but does so in a particularly effective and economical manner. It is recognized, of course that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. Apparatus for preventing tipping of a boat holding semiconductor devices, said boat being carried on a moveable transport arm, comprising:

fence structure mounted on said transport arm, said fence structure extending upwardly from said transport arm and surrounding a portion of said boat whereby to be contacted by the sides of said boat when said boat tips, and means for sensing when said boat tips and for producing electrical signal when said boat has tipped at least a preselected amount, said sensing means includes first sensing means mounted on said fence structure for sensing the tipping movement of an upper portion of said boat, and second sensing means mounted on said arm for sensing tipping movement of a lower portion of said boat.

2. The apparatus of claim 1, wherein said fence structure includes:

a plurality of upright, elongated supports each having the lower end thereof secured to said arm, and an arcuately shaped fence secured to the upper ends of said supports.

3. The apparatus of claim 1, wherein said fence structure includes resilient means for absorbing the shock of said boat when said boat tips into contact with said fence structure.

4. The apparatus of claim 3, wherein said resilient means includes a plurality of displaceable guard sections and spring means normally biasing said guard sections toward said boat.

5. The apparatus of claim 4, wherein said sensing means includes a plurality of limit switches respectively mounted on said fence structure and said arm and actuated by displacement of an associated one of said plurality of displaceable guard sections.

6. The apparatus of claim 1, wherein first and second sensing means includes a plurality of sensors circumferentially spaced about an upright axis, each operable to produce an electrical signal indicating tipping movement of said boat in the direction of the associated sensor.

7. The apparatus of claim 1 including control means connected to said transport arm for controlling the movement of said transport arm, said control means being responsive to said electrical signal from said sensing means to stop the movement of said transport arm.

8. For use in a semiconductor carrying boat transport system of the type including a boat elevator for inserting and withdrawing said boat from a process chamber and a boat transfer arm for transferring said boat from a wafer transfer position to a loading position aligned above said boat elevator whereat said elevator may engage and move said boat upwardly into said process chamber, apparatus for controlling tipping movement of said boat on said arm comprising:

a guard fence carried on end extending upward from said arm, said fence being operative to engage and limit the tipping movement of said boat;

sensor means responsive to the tipping movement of said boat for producing an electrical signal indicative of said tipping movement; said sensor means includes a first sensor assembly mounted on said arm for sensing tipping of the bottom of said boat, and a second sensor assembly mounted on said fence for sensing tipping movement of upper portion of said boat; and control means coupled with said sensor means and responsive to said electrical signal for controlling the operation of said elevator.

9. The apparatus of claim 8, wherein said first sensor assembly being engageable by said boat when said boat tips relative to said arm.

10. The apparatus of claim 8, wherein said sensor means includes:

a cover disposed above said elevator and having an opening therein through which said boat may pass, means for movable mounting said cover so as to deflect when engaged by said boat as said elevator elevates said boat when said boat has tipped, and a plurality of sensors mounted on said arm and said fence structure for sensing deflection of said cover.

11. The apparatus of claim 8, wherein said fence includes an arcuate member surrounding a portion of said boat and supported at a position spaced above said arm.

12. The apparatus of claim 11 wherein said fence includes a plurality of guard members, means for moveably mounting said guard members in spaced-apart relationship on said fence, and a plurality of sensors mounted on said fence and actuated by the movement of said guard members when said boat tips into engagement with one of said guard members.

* * * * *